US005573975A

United States Patent [19]

Cunningham et al.

[11] Patent Number: 5,573,975
[45] Date of Patent: Nov. 12, 1996

[54] SURFACE-NORMAL SEMICONDUCTOR OPTICAL CAVITY DEVICES

[75] Inventors: John E. Cunningham, Lincroft; Keith W. Goossen, Aberdeen, both of N.J.

[73] Assignee: Lucent Technologies Inc., Murray Hill, N.J.

[21] Appl. No.: 417,878

[22] Filed: Apr. 6, 1995

Related U.S. Application Data

[62] Division of Ser. No. 334,821, Nov. 4, 1994, Pat. No. 5,444,270.

[51] Int. Cl.$^6$ .................................................. H01L 21/20
[52] U.S. Cl. .......................................... 437/129; 437/127
[58] Field of Search .................................... 437/129, 126, 437/127

[56] References Cited

U.S. PATENT DOCUMENTS

| 5,005,058 | 4/1991 | Tanaka | 257/98 |
| 5,077,587 | 12/1991 | Albergo et al. | 257/437 |
| 5,177,581 | 1/1993 | Kubo et al. | 257/437 |
| 5,293,392 | 3/1994 | Shieh et al. | 437/129 |
| 5,298,454 | 3/1994 | D'Asaro et al. | 437/129 |
| 5,397,739 | 3/1995 | Chalmers et al. | 437/129 |

FOREIGN PATENT DOCUMENTS

| 208259 | 9/1986 | Japan | 257/98 |

OTHER PUBLICATIONS

"Electroabsorptive Fabry–Perot Reflection Modulators With Asymmetric Mirrors", R. H. Yan et al., *IEEE Photonics Technology Letters*, vol. No. 1, No. 9, pp. 273–275, Sep. 1989.

Co–pending United States Patent Application Serial No. 08/236,618, K. W. Goossen Case 17, filed May 2, 1994 entitled "Surface Normal Semiconductor Optical Cavity Devices".

*Primary Examiner*—R. Bruce Breneman
*Assistant Examiner*—Linda J. Fleck
*Attorney, Agent, or Firm*—Stuart H. Mayer

[57] ABSTRACT

A semiconductor device is provided that includes an optical cavity that is designed to provide a prescribed resonant optical wavelength. The optical cavity includes a mirror structure deposited on top of a substrate and a multi-layer region such as an electroabsorptive region, for example, deposited over the mirror structure. A partial antireflective coating is deposited over the multi-layer region. The mirror structure and the multilayer region have a thickness variation sufficient to yield a resonant optical wavelength that deviates from the prescribed resonant wavelength. The partial antireflective coating has a non-uniform thickness variation that causes the resonant optical wavelength to shift substantially toward the prescribed resonant optical wavelength.

7 Claims, 5 Drawing Sheets

SURFACE-NORMAL SEMICONDUCTOR OPTICAL CAVITY DEVICES

This is a division of application Ser. No. 08/334,821 filed Nov. 4, 1994, now U.S. Pat. No. 5,444,270.

TECHNICAL FIELD

This invention relates to semiconductor devices and, more particularly, to surface-normal semiconductor optical cavity devices.

BACKGROUND OF THE INVENTION

Considerable effort has recently been directed to the development of surface-normal semiconductor optical cavity devices such as surface-emitting lasers and asymmetric Fabry-Perot modulators. For a description of a typical such device, see, for example, "Electroabsorptive Fabry-Perot Reflection Modulators with Asymmetric Mirrors", by R. H. Yan et al, *IEEE Photonics Technology Letters*, Vol. 1, No. 9, pages 273–275, September 1989.

In contrast with edge-emitting or waveguide-type optical devices, surface-normal optical devices of the type described in the afore-cited article lend themselves relatively easily to the formation of two-dimensional arrays. Such arrays are useful in a variety of practical applications such as optical interconnects, laser printers and smart-pixel systems A typical surface-normal semiconductor optical cavity device includes a multi-layer mirror structure on top of which is formed a multi-layer electroabsorptive region. Another mirror is then formed on top of the electroabsorptive region. An optical cavity, exhibiting resonance at a prespecified wavelength, is thereby formed in the device, as is well known in the art.

To achieve a good-quality surface-normal semiconductor optical device, it is essential that the thicknesses of the layers constituting the optical cavity be fabricated with good precision and accuracy. In actual devices, the thicknesses of the layers of the cavity must, for example, often be controlled over their entire extents to vary less than one percent from prescribed thickness values.

In practice, a shift in the overall thickness of the cavity layers of such a device by one percent causes a corresponding shift of one percent in the cavity resonance. For a device designed, for example, to operate at a wavelength of 850 nanometers (nm), such a thickness variation would thus cause a shift of 8.5 nm in the resonance wavelength. In many cases, such a shift is comparable to or larger than the width of the resonance of the cavity. Hence, a device fabricated with such a variation in its cavity thickness would not be acceptable for use at the designated wavelength. Accordingly, methods such as those disclosed in U.S. patent application Ser. No. 08/236,618, for example, have been developed to provide a more accurate and precise method of fabricating the multiple cavity layers of a surface-normal semiconductor optical device with minimal variation in thickness.

SUMMARY OF THE INVENTION

The inventors of the present invention have discovered that by intentionally increasing the nonuniformity of one of the layers forming the optical cavity, undesirable shifts in the resonant or center wavelength from its prescribed value can be reduced. In particular, these shifts can be reduced by employing a partial antireflective coating that serves as the top mirror of the cavity.

In one embodiment of the invention, a semiconductor device is provided that includes an optical cavity that is designed to provide a prescribed resonant optical wavelength. The optical cavity includes a minor structure deposited on top of a substrate and a multi-layer region such as an electroabsorptive region, for example, deposited over the mirror structure. A partial antireflective coating is deposited over the multi-layer region. The mirror structure and the multilayer region have a thickness variation sufficient to yield a resonant optical wavelength that deviates from the prescribed resonant wavelength. The partial antireflective coating has a non-uniform thickness variation that causes the resonant optical wavelength to shift substantially toward the prescribed resonant optical wavelength.

In another embodiment of the invention a method is provided for fabricating a semiconductor optical cavity device. The method includes the steps of successively depositing onto a substrate layers that constitute a mirror structure followed by layers that constitute a multi-layer region. A partial antireflective coating is provided over the multi-layer region such that the coating has a thickness variation over its extent that is equal in sign to, but greater in magnitude than, thickness variations in the multilayer region and the mirror structure.

DETAILED DESCRIPTION

Figure 1:
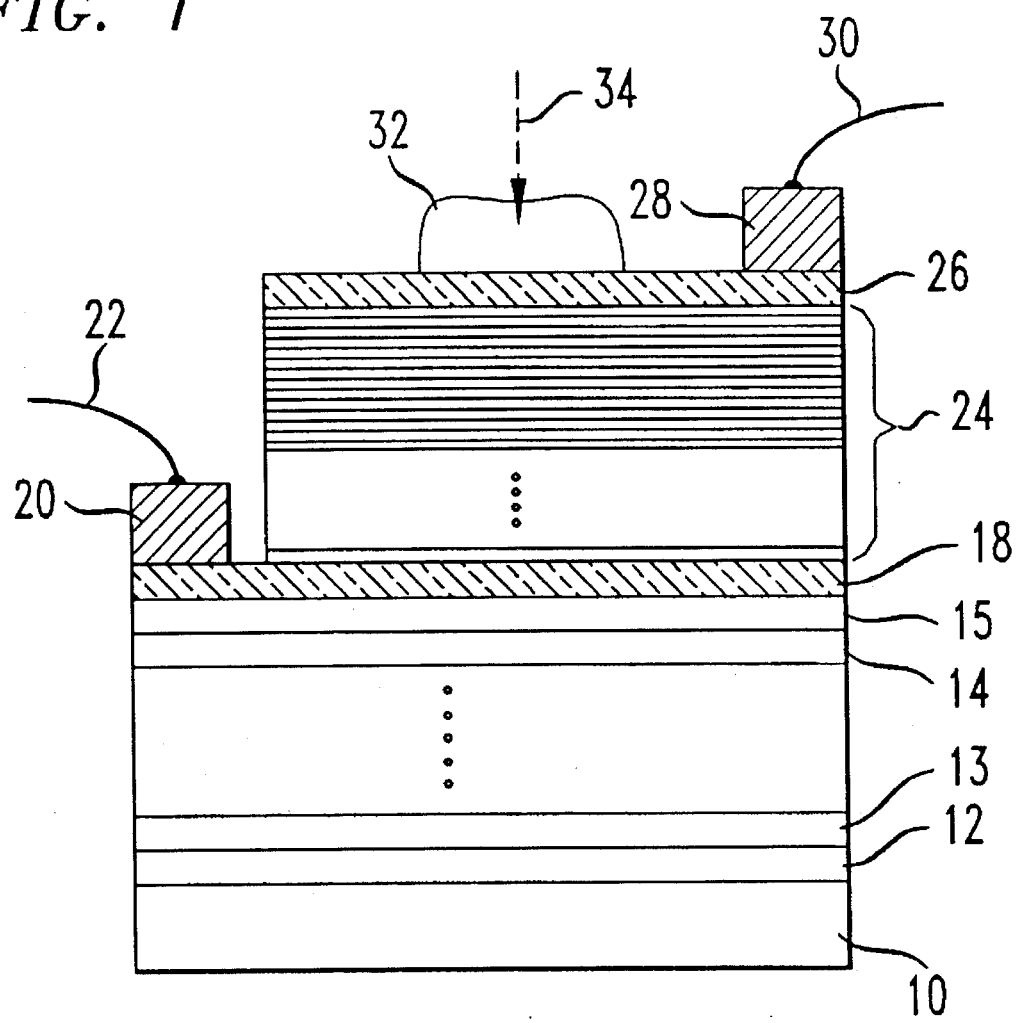
FIG. 1 is a representation in cross-section, not drawn to scale, of a specific illustrative surface-normal semiconductor optical cavity device made in accordance with the principles of the present invention.

The specific illustrative improved asymmetric Fabry-Perot electroabsorptive optical modulator shown in FIG. 1 in accordance with the invention comprises a substrate 10 made, for example, of gallium arsenide (GaAs). The substrate 10 may be undoped or it may be doped with a suitable n-type dopant such as silicon. By way of example, the thickness or Y-direction dimension of the substrate 10 is about 500 micrometers (µm). Further, the index of refraction of the substrate 10 is approximately 3.6. In practice, it is generally advantageous to form on the substrate 10 of FIG. 1 an integrated-circuit assembly comprising multiple optical modulator devices. Herein, so as to simplify the drawing and the accompanying description, only one optical cavity device of such an assembly is explicitly shown in FIG. 1.

In accordance with the principles of the present invention, multiple successive layers constituting a mirror structure are deposited in sequence on the top surface of the substrate 10.

(This top surface is parallel to the X-Z plane depicted in FIG. 1.) Illustratively, the mirror structure comprises 15-to-30 such layers. Only the first and last two pairs of the multiple deposited mirror layers are explicitly shown in FIG. 1. The depicted first and last pairs of mirror layers are respectively designated in FIG. 1 by reference numerals 12, 13 and 14, 15.

The first deposited mirror layer 12 of FIG. 1 comprises, for example, a 713-μm-thick layer of aluminum gallium arsenide (AlGaAs) having an index of refraction of about 2.98. The second deposited layer 13 comprises, for example, a 607-μm-thick layer of aluminum arsenide (AlAs) having an index of refraction of approximately 3.5. Substantially identical additional layers of AlGaAs and AlAs are then repeatedly deposited in an interleaved fashion overlying the layer 13 to complete the mirror structure represented in FIG. 1. The multiple layers of the mirror structure may each be doped or undoped.

For a modulator device designed to operate at a particular center optical wavelength, each layer of the mirror structure shown in FIG. 1 is fabricated to have a thickness equal to $\lambda/4n$, where $\lambda$ is the center optical wavelength of the device and n is the index of refraction of the layer. Such a multi-layer mirror structure is designed to be highly reflective to optical signals at the center wavelength.

Next, in a device made in accordance with the principles of the present invention, an optically transparent conductive layer 18 made, for example, of doped AlGaAs may be deposited on top of the top-most mirror layer 15 of FIG. 1. In certain devices, such as those for which the top-most layer 15 is doped, for example, the additional layer 18 is not required. The layer 15, which, illustratively, is doped with an n-type dopant such as silicon, serves as an electrically conductive layer that will be used in conjunction with a subsequently deposited conductive layer to apply electrical signals to the modulator device. By way of example, the thickness of the layer 18 is approximately 500 Angstrom units, and its index of refraction is 3.5.

An electrical connection is made to the conductive layer 18 of FIG. 1 by means of contact 20. For the case in which the layer 18 is doped with an n-type dopant, the contact 20 is made, for example, of a standard gold/germanium mixture. (For a layer 18 doped with a p-type dopant such as beryllium, the contact 20 is made, for example, of a conventional gold/zinc mixture.) In either case, an electrical lead 22 connects the contact 20 to a source (not shown) of electrical signals that are to modulate the optical signals applied to the depicted device.

Overlying the layer 18 of the Fabry-Perot modulator device of FIG. 1 is an electroabsorptive region 24. Advantageously, as is well known in the art, the electroabsorptive region 24 comprises, for example, a conventional multiple-quantum-well (MQW) region that includes multiple layers. Illustratively, the region 24 comprises about fifty alternating layers of undoped GaAs and AlAs. By way of example, the region 24 is characterized by an index of refraction of 3.5.

As is well known, the resonance wavelength of the modulator device depicted in FIG. 1 is determined by the bandgap of the MQW region. In one particular example, the design of the region 24 is such that the resonance wavelength of the device is specified to be 850 nm. In that case, the optical signals to be directed at the device would have a center wavelength of 850 nm. And, as mentioned above, the afore-described mirror structure would be correspondingly designed to be highly reflective at this center wavelength and to exhibit, for example, an optical bandwidth of approximately 800-to-900 nm.

The next layer in the FIG. 1 device may comprise another optically transparent and electrically conductive layer. This layer, which is designated in FIG. 1 by reference numeral 26, also comprises, for example, a 500-Angstrom unit-thick layer of doped AlGaAs having an index of refraction of 3.5. For the case in which the lower conductive layer 18 is n-doped, the upper layer 26 would be advantageously p-doped. On the other hand, if the lower layer 18 is p-doped, the upper layer 26 would be n-doped. In either case, an appropriate electrical contact 28 is made to the layer 26. In turn, an electrical lead 30 connects the contact 28 to the aforementioned source of electrical modulation signals. Optical signals to be modulated are directed at the FIG. 1 device approximately normal to the top surface of the layer 26. Such signals are schematically represented by dashed line 34.

The top-most layer of the FIG. 1 device is a partial antireflective (PAR) coating for reducing the top-surface reflectivity. This layer, designated by reference numeral 32, comprises, for example, an $SiO_2$ layer. The PAR coating should be chosen to have a refractive index that is lower than that of the underlying layers, and preferably a refractive index lower than the square root of the refractive index of the underlying layers. Requiring that the PAR coating fulfill this criterion ensures that a partial antireflective coating results and not a perfect antireflective coating.

Since optical waves propagating in the FIG. 1 device actually extend into the mirror structure, the effective overall thickness of the optical cavity extends in the Y direction from the top of the layer 32 into the depicted mirror structure. In practice, the thickness of the cavity is defined by the relationship $m\lambda/2n$, where m is a positive integer, $\lambda$ is the center or resonance wavelength of the device as determined by the bandgap of the electroabsorptive region 24 and n is the index of refraction of the cavity, as is well known in the art. For the sake of clarity in what follows, the layers of the optical cavity below the PAR coating (i.e., the mirror structure, the electroabsorptive region, and the transparent layers, if present) will be referred to as the underlying layers of the optical cavity.

The top-most layer 32 of FIG. 1 can in effect serve as the required top mirror of the depicted modulator device. In particular, reflection of a portion of the incident optical signal occurs at the interface between the top surface of the layer 32 and the medium (usually air) that overlies the device. The net resultant amount of light that is reflected back from the layer 32 and the lower mirror comprising the afore-described multi-layer mirror structure is a function of the electric field applied to the electroabsorptive region 24 included in the optical cavity. Thus, by applying a modulating electrical signal to the region 24 as described above, it is possible to control the amount of light that is reflected back from the device, as is well known in the art.

Since the value of the center wavelength depends on the overall thickness of the optical cavity, it is important that the thickness of the optical cavity of the FIG. 1 device be tightly controlled to ensure a high modulation efficiency. Illustratively, the overall thickness of the cavity must be controlled to be less than plus or minus one percent of a prescribed value.

Figure 2:
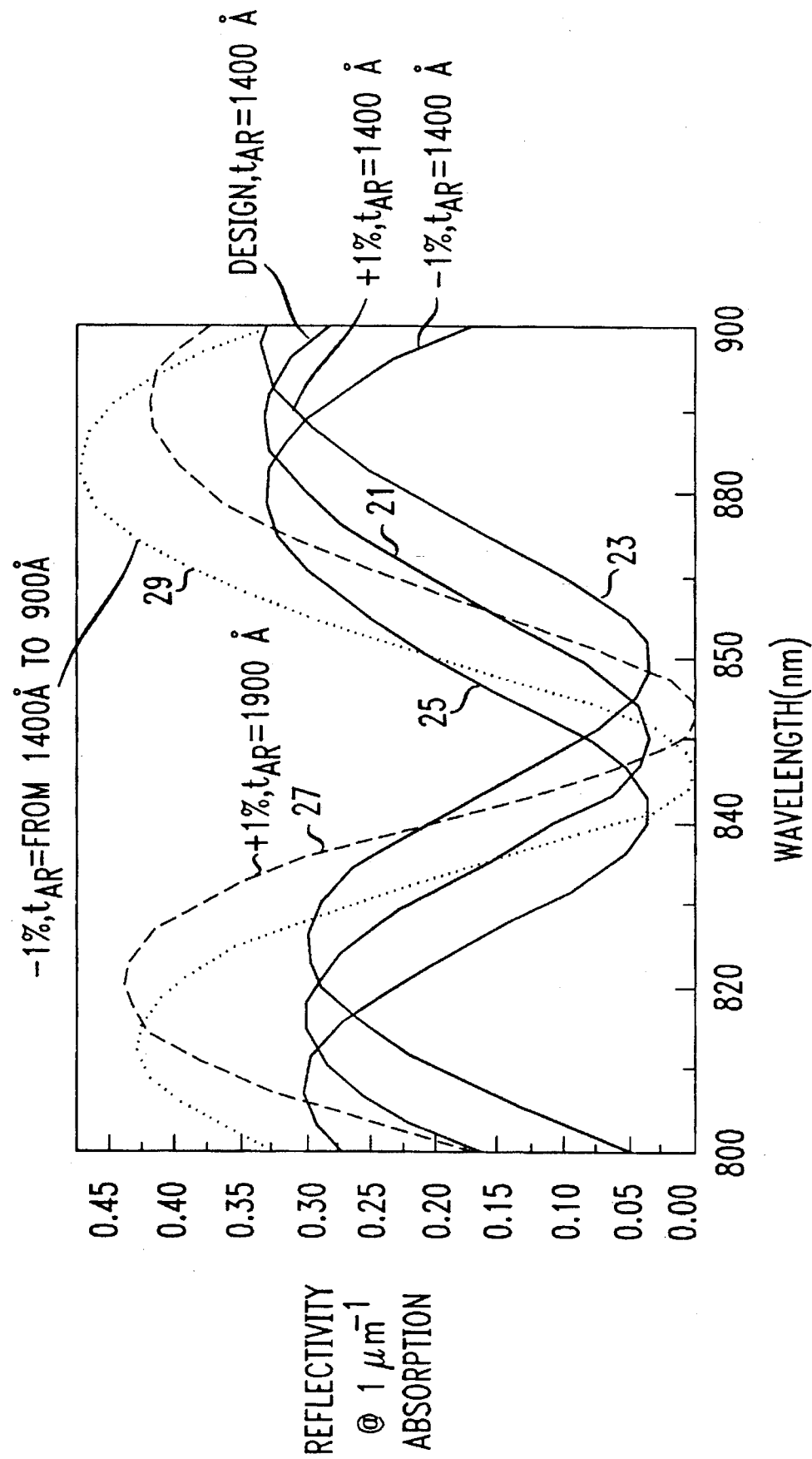
FIG. 2 show reflectivity as a function of wavelength for asymmetric Fabry-Perot modulator devices having a partial antireflective coating with various thickness deviations.
Figure 3:
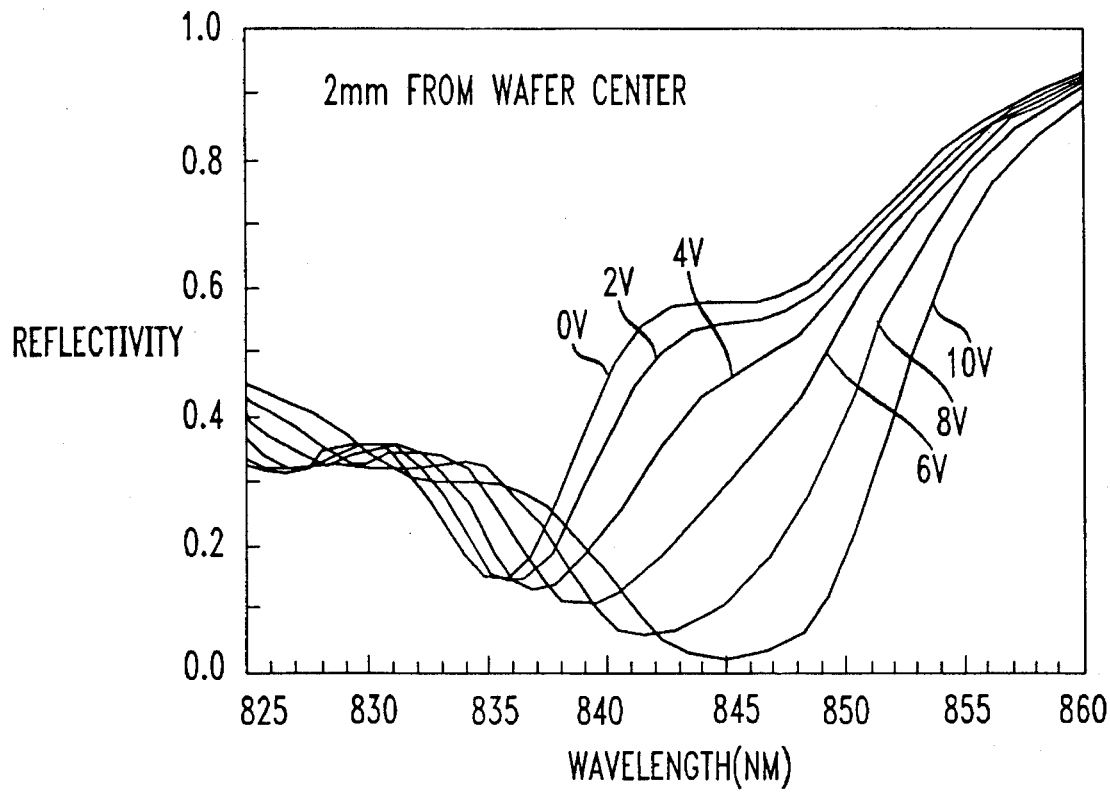
FIGS. 3–6 show reflectivity as a function of wavelength for modulator devices fabricated on a common substrate at a distance of 2 mm, 10 mm, 18 mm, and 24 mm from the substrate center, respectively.

In practice, because of the techniques employed to fabricate the modulator device of FIG. 1, the ability to deposit layers whose thicknesses are relatively invariant over their entire extents is limited. Thus, for example, conventional techniques can typically only deposit layers each of whose thicknesses varies over its entire extent by at least plus or minus one or two percent from a prescribed thickness value. Accordingly, the thickness of the optical cavity of a conventional FIG. 1 device can also be controlled in practice only at best to plus or minus one percent. As a result, the resonance wavelength of the cavity can actually vary by about one percent from a prescribed center wavelength. Such a variation (for example, 8.5 nm for a device designed to operate at 850 nm) can in many cases be comparable to or even greater than the width of the resonance of the electroabsorptive region. For such a variation, the fabricated device would not be suitable for effective operation at the prescribed center wavelength. This behavior is illustrated by the solid lines shown in FIG. 2. Curve 21 depicts the spectrum of an ideally fabricated device designed to operate at a prescribed resonant wavelength of 850 nm. The device is designed to have a PAR coating 1400 Å thick. Curves 23 and 25 show the spectra for an increase and a decrease, respectively, of one percent in the thickness of the optical cavity. As curves 23 and 25 indicate, the center wavelength shifts a corresponding amount from its prescribed value.

Layer thickness variations occur as an inherent consequence of the various growth processes employed to fabricate modulator devices. Typically, evaporation processes such as molecular beam epitaxy (MBE) are used to evaporate selected materials from different sources onto a substrate to form the various layers. The substrate is typically positioned symmetrically with respect to the sources. However, because of geometric effects, the quantity of material reaching the center of substrate is greater than the amount of material reaching its outer portions, resulting in a corresponding variation in the thickness of the deposited materials. Accordingly, the individual layers forming the modulator device typically are thickest at the center of the substrate and decrease in thickness in a radially outward direction toward the periphery of the substrate.

The shift in the center wavelength of the modulator device caused by the variation in layer thickness is illustrated in FIGS. 3–6, which show spectra for modulator devices fabricated on a common substrate at a distance of 2 mm, 10 mm, 18 mm, and 24 mm from the substrate center, respectively. In particular, an examination of the zero bias curves in FIGS. 3–6 indicate that the center wavelength is initially near 846 nm at a distance of 2 mm from the substrate center (FIG. 3) and shifts to shorter wavelengths for increasingly distant portions of the substrate. In this example the modulator devices were grown by gas-source molecular beam epitaxy on a 2 inch round n-type GaAs substrate. The bottom mirror structure was composed of ten periods of AlAs/ $Al_{0.15}Ga_{0.85}As$ (707 Å/601 Å), followed by an electroabsorptive region composed of 72 periods of intrinsic GaAs/ AlAs (90 Å/20 Å) that form a multiple quantum well structure. A 1000 Å transparent conductive layer composed of $Al_{0.15}Ga_{0.85}As$ was next deposited followed by a 50 Å $p^+$GaAs cap layer. Finally, the PAR coating was composed of a 1600 Å $SiO_2$ layer (n≈1.5) deposited by chemical vapor deposition.

In accordance with the present invention, the inventors have discovered that a PAR coating having a nonuniform thickness that has a variation that is equal in sign, i.e., an increase or decrease in thickness, (but not magnitude) to the thickness variation of the underlying optical cavity layers can reduce the undesirable shifts in the center wavelength from its prescribed value caused by non-uniform layer thickness. That is, a modulator device having a region in which the underlying optical cavity layers exceed their prespecified thickness due to errors occurring in growth may be compensated for by increasing the thickness of the PAR coating so that the center wavelength shifts back toward its prescribed value. Similarly, a region in the underlying layers of the optical cavity having a thickness less than the prespecified value may be compensated for by decreasing the thickness of the PAR coating. This behavior is illustrated by the dashed curves in FIG. 2.

Curve 27 shows the spectrum for a device in accordance with the present invention having underlying optical cavity layers that exceed by one percent the thickness required for operation at the prescribed wavelength of 850 nm. As noted above, the center wavelength would shift to a value greater than the prescribed wavelength if no compensation were provided, as indicated by curve 23. However, by increasing the thickness of the PAR coating from its initial value of 1400 Å to 1900 Å, the center wavelength shifts back toward its prescribed value of 850 nm. Similarly, curve 29 shows the spectrum for the device when its underlying optical cavity layers have a thickness 1 percent less than that required for operation at 850 nm and a PAR coating whose thickness is decreased from 1400 Å to 900 Å. As curve 29 indicates, the center wavelength has again shifted back toward its prescribed value of 850 nm. It should be noted that while variations in the underlying optical cavity layers may be compensated by a PAR coating thickness that replicates these thickness variations in sign, the magnitude of the variations in the PAR coating and the underlying layers generally differ. For example, for the device in FIG. 2, a 1 percent increase in layer thickness is compensated by a 36 percent increase in PAR coating thickness. The inventors have determined that in general a thickness deviation greater than approximately 10% is typically optimal to shift the center wavelength back to the vicinity of the prescribed center wavelength. This deviation is substantially greater than the 1 or 2% deviation that is typically employed in prior art devices. The precise deviation in thickness that is optimal for any given device may be determined empirically. Thus, in contrast to prior art, which seeks to provide layers as uniform in thickness as possible over their entire extent, in the present invention the devices are intentionally fabricated with a PAR coating that is substantially non-uniform in thickness.

The manner in which the present invention compensates for non-uniformities in optical cavity thickness is surprising because the center or resonant wavelength of an optical cavity is typically directly proportional to the thickness of the cavity. Thus, it would be initially anticipated that a 1 percent increase in the thickness of the underlying optical cavity layers would be corrected by a decrease in the thickness of the PAR coating so that the overall thickness of the optical cavity equals its prespecified value. However, as explained above, the inventors have discovered that precisely the opposite variation in PAR coating thickness is required. The inventors believe that this phenomena may be explained by the following simplified model which is presented solely to facilitate and reinforce an understanding of the invention and which is not intended to limit the scope of the invention to those devices that behave in accordance with these theoretical considerations.

An analysis of the relative phases of the reflectivities of the various interfaces in the modulator device shows that variations in the thickness of the underlying optical cavity layers are compensated by variations in the PAR coating thicknesses of the same sign. In particular, this effect occurs because while the phase of the reflectivity at the PAR coating-air interface and the phase of the reflectivity at the electroabsorptive region-mirror structure interface have the same sign (which is opposite to the sign of the reflectivity at the PAR coating-electroabsorptive region interface) they change in the opposite direction with respect to changes in layer thickness. That is, the relative phase difference in the reflectivities at the air-PAR coating interface and PAR coating-electroabsorptive region interface decrease as the layers become thinner (since an optical signal undergoing reflection at the PAR coating-electroabsorptive region interface experiences a decrease in optical path length), while the relative phase difference in the reflectivities at the electroabsorptive region-mirror structure interface and the PAR coating-electroabsorptive region interface increase (since an optical signal undergoing reflection at the PAR coating-electroabsorptive region interface experiences a decrease in optical path length). More specifically, the reflectivity R of the modulator device can be expressed as follows:

$$R = \alpha_{r,e}^{4i\pi s/\lambda} + r_1^- r_2 A_e^{-4i\pi d/\lambda}$$

where $r_1$ is the reflectivity at the PAR coating-electroabsorptive region interface, $r_2$ is the reflectivity of the mirror structure, A is the absorbance due to traversing the optical cavity twice, s is the PAR-coating thickness, and d the optical cavity thickness. The wavelength $\lambda$ denotes the wavelength in each of the respective layers in which the term appears. If $\alpha=1$ and $s=\lambda/4$, the PAR coating forms a perfect antireflection coating and hence $\alpha$ and s cannot take on these values. To produce a Fabry-Perot resonance, $d=\lambda/2$. If d and s are approximately equal to $\lambda/2$ and $\lambda/4$, respectively, changes in d are compensated by changes in s of the same sign, in accordance with the inventive method specified herein.

A figure of merit that may be used to characterize the modulator device is its contrast ratio, which is the ratio of its maximum to minimum reflectivity at the center wavelength determined by applying the appropriate biasing to the device. After detailing the manner in which the applied bias determines the reflectivity of the device, it will demonstrated that a device fabricated in accordance with the present invention is characterized by an enhanced contrast ratio. In operation, optical absorption by the electroabsorptive region of the modulator device effectively decreases the amount of light reflected from the mirror structure adjacent the substrate. By applying a bias to the electroabsorptive region the amount of absorption changes and the amount of light reflected from the mirror structure changes. If the modulator device is configured, for example, so that at a given bias the reflectivity from the mirror (as reduced by the absorption from the electroabsorptive region) equals the reflectivity from the PAR coating, the overall reflectivity from the modulator device is substantially equal to zero. By changing the bias applied to the electroabsorptive region the balance in reflectivity between the mirror structure and the PAR coating is disrupted, causing the overall reflectivity of the modulator device to increase. In this manner, as noted earlier, a change in the net amount of light reflected from the modulator device is a function of the change in bias applied to the electroabsorptive region.

Figure 4:
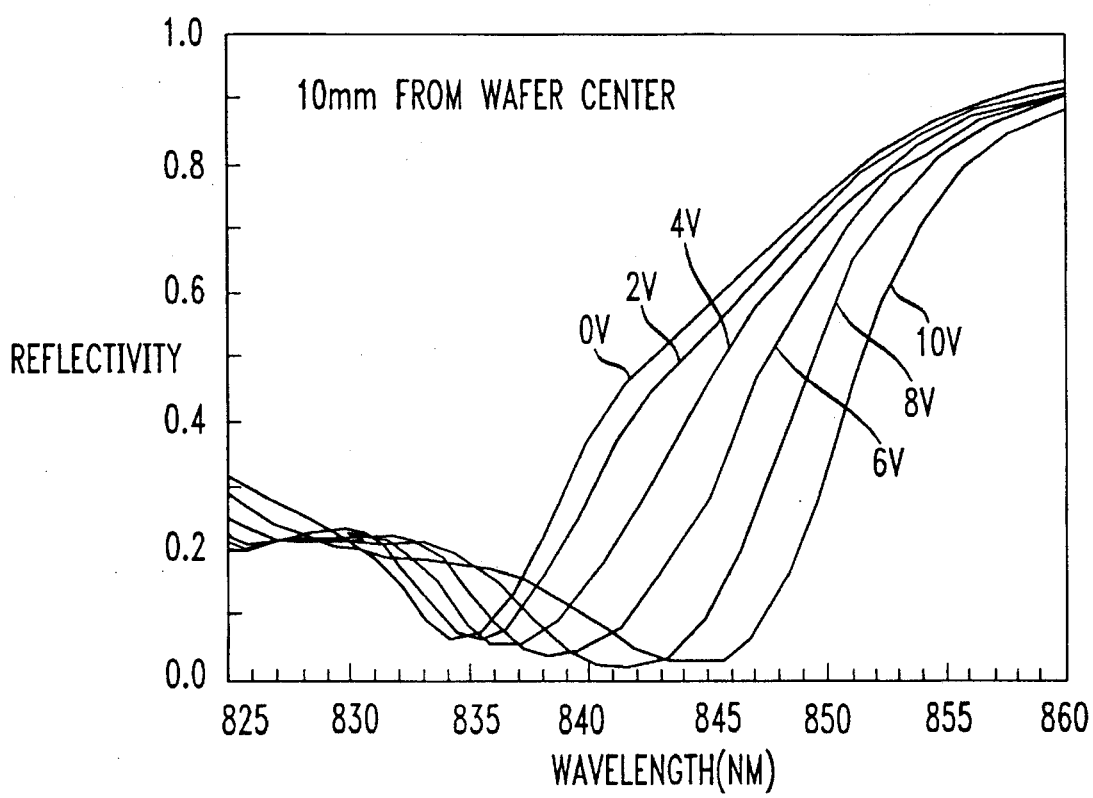
Figure 5:
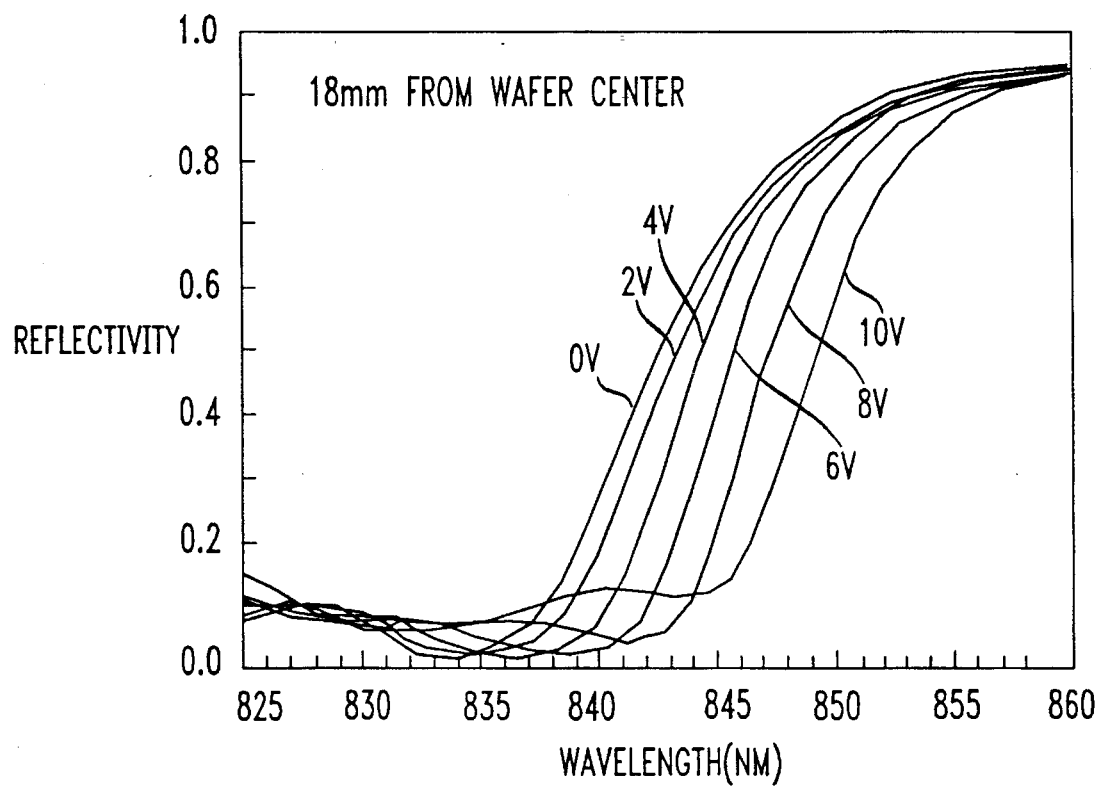
Figure 6:
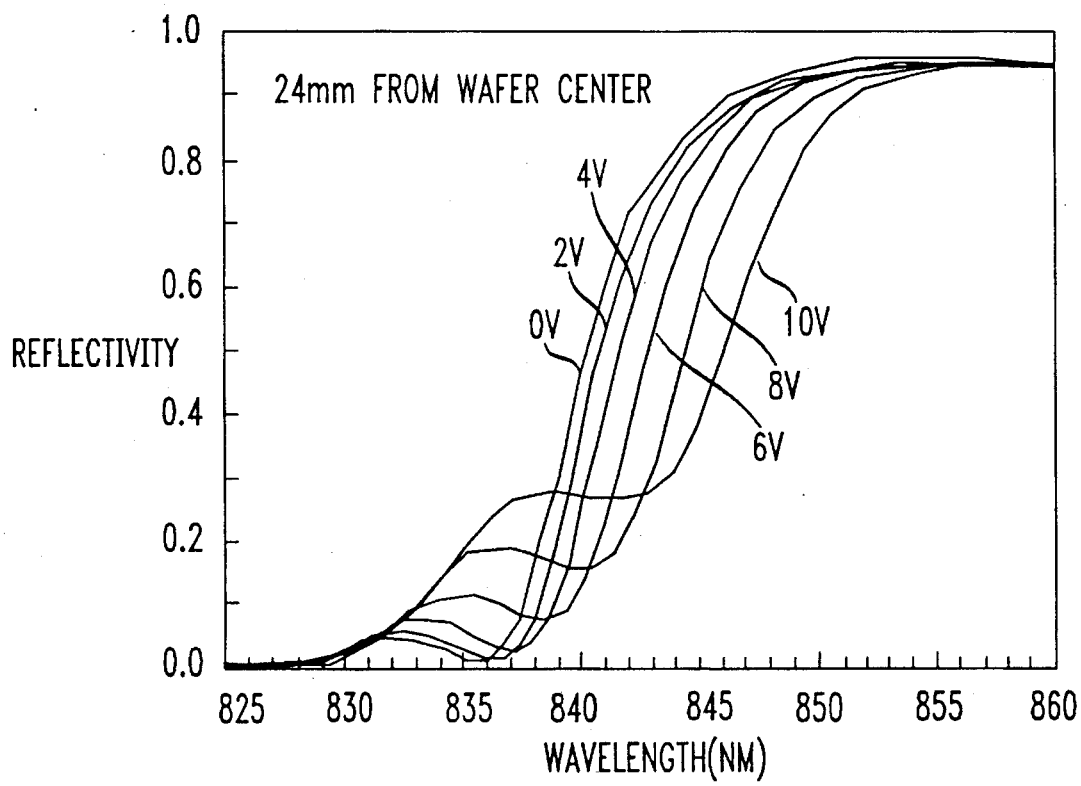

FIGS. 3–6 show the spectra for different bias values of the aforementioned devices which were fabricated on portions of a common substrate increasingly remote from the substrate center. The figures indicate that the resonant wavelength decreases with distance from the substrate center. In the FIG. 3 device, which was fabricated 2 mm from the substrate center, the resonant wavelength is near 846 nm, while the MQW exciton is near 835 mm. The resonance is weaker and broader in this device than in conventional asymmetric Fabry-Perot modulator devices due to the reduced finesse of the optical cavity. As expected for a conventional modulator device, the reflectivity drops to near zero as the exciton shifts with increasing bias into the Fabry-Perot resonance. In FIGS. 4–6 the Fabry-Perot resonance becomes more difficult to observe as it shifts to shorter wavelengths near the exciton.

Figure 8:
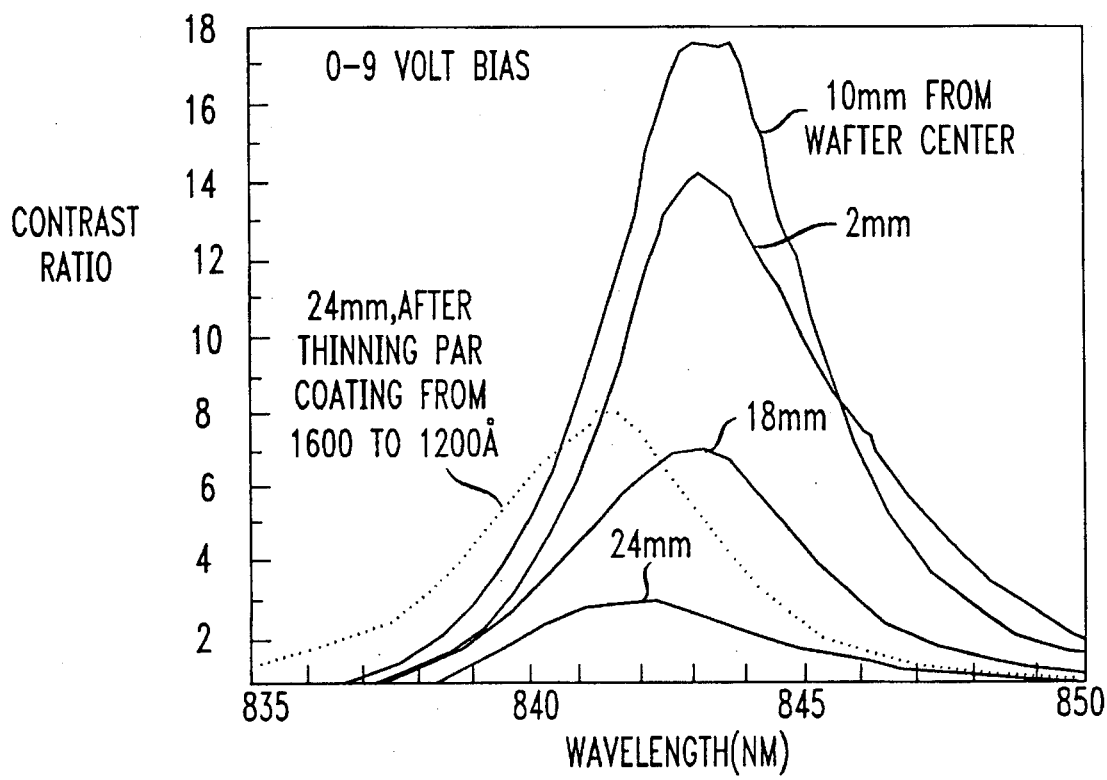
FIG. 8 shows the contrast ratios for the modulator devices of FIGS. 3–7.

The solid curves in FIG. 8 show the contrast ratio for the devices of FIGS. 3–6 for a bias of 9 volts. The figure suggests that as the deviation in optical cavity thickness increases from its prespecified value with increasing distance from the substrate center, the contrast ratio of the device decreases. While relatively high contrast is still achieved for the devices fabricated 2, 10, and 18 mm from the substrate center (FIGS. 3–5), the device fabricated 24 mm from the substrate center (FIG. 6), which has the greatest deviation from the prespecified optical cavity thickness, shows a significant decrease in contrast.

Figure 7:
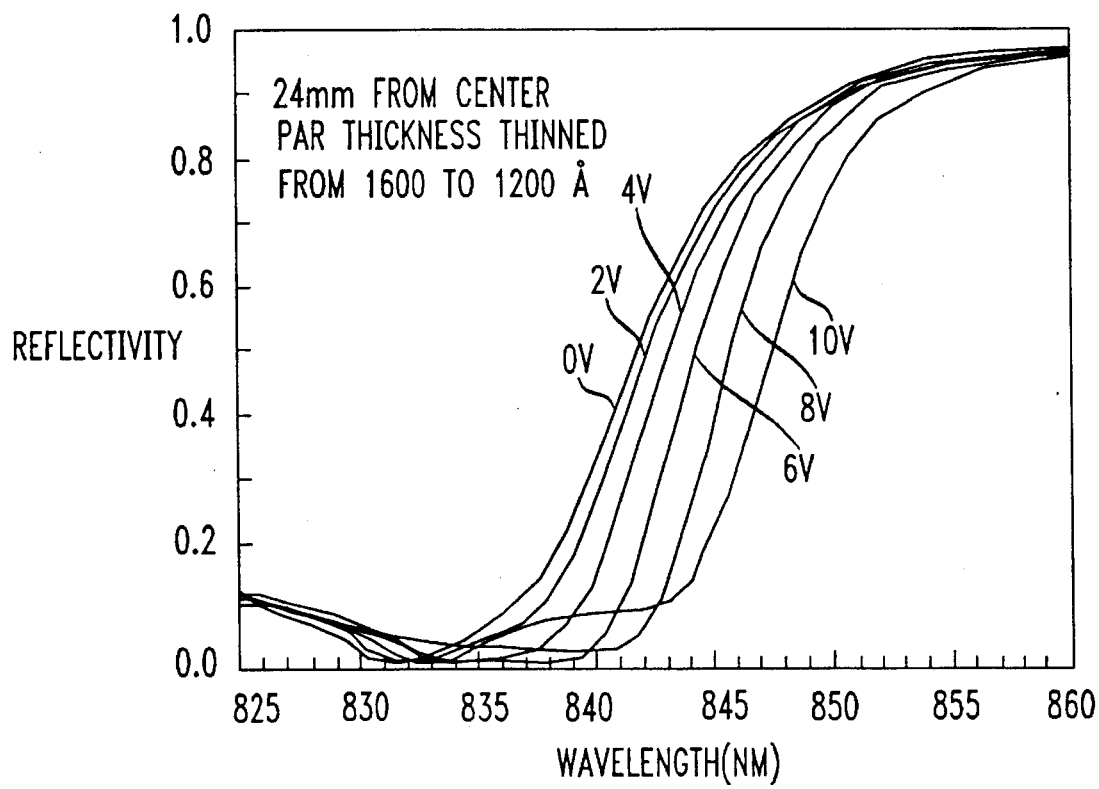
FIG. 7 shows the reflectivity as a function of wavelength for the modulator device of FIG. 6 after its PAR coating has been reduced in thickness in accordance with the present invention.

FIG. 7 shows the modulator device of FIG. 6 after its PAR coating has been decreased in thickness in accordance with the present invention to compensate for the decrease in thickness of the underlying optical cavity layers from their prespecified value. In this case the PAR coating has been reduced from 1600 Å to 1200 Å by etching the device for 15 seconds in an HF-based buffered oxide etchant solution. The resulting contrast ratio of the device after etching is shown by the dashed curve in FIG. 8. As expected from the above discussion, the thinner PAR coating shifts the center wavelength to a greater value, thus providing a device having greater contrast. By thinning the PAR coating in this manner the contrast increases from about 2.5:1 for the FIG. 6 device to about 8:1 for the FIG. 7 device.

For the device of FIG. 7 steps subsequent to layer growth were necessary to reduce the thickness of the PAR coating to its proper value. While in this example the subsequent steps employed an etchant to reduce the thickness, more generally the present invention contemplates the use of any appropriate measures to achieve the proper PAR coating thickness. Moreover, the appropriate PAR coating thickness may be achieved during its initial growth so that no subsequent steps are necessary to obtain the final fabricated device. In fact, this latter approach is particularly advantageous because it takes advantage of the natural tendency of the conventional growth techniques to provide a layer thickness that is non-uniform in the manner prescribed by the present invention. That is, these techniques provide a greater thickness near the center of the substrate and a lesser thickness near the periphery. This tendency exists because the same geometric effects that cause the non-uniformity in the thickness of the underlying optical cavity layers also cause the non-uniformity in the PAR coating thickness. Thus, if the particular fabrication technique employed produces a variation in the thickness of the optical cavity of say, 2 percent between the center and periphery of the substrate, the same technique will produce a 2 percent variation in the thickness of the PAR coating. As noted above, while the conventional fabrication techniques yield a thickness variation in the PAR coating that replicates in sign the thickness deviation of the underlying optical cavity layers, the magnitude of this replication is not sufficient to compensate for the thickness deviation of the optical cavity. For example, as noted above, a 2% variation in the thickness of the underlying optical cavity layers may require a 10–20% change in thickness of the PAR coating. One convenient way to produce such a large thickness variation during the initial growth of the PAR coating is to reduce the distance between the source and substrate.

What is claimed is:

1. A method for fabricating a semiconductor optical cavity device, comprising:

successively depositing layers that constitute a mirror structure onto a substrate;

successively depositing layers that constitute a multi-layer region onto said mirror structure;

providing a partial antireflective coating over said multi-layer region such that said coating has a thickness variation over its extent that is equal in sign to, but greater in magnitude than, thickness variations in the multi-layer region and the mirror structure.

2. The method of claim 1 wherein the step of providing a partial antireflective coating comprises the step of depositing the partial antireflective coating.

3. The method of claim 2 wherein said partial antireflective coating is deposited so that it has a thickness variation at least equal to approximately 10% over its entire extent.

4. The method of claim 1 wherein the deposition step further comprises the step of etching the partial reflective coating to achieve said thickness variation.

5. The method of claim 1 wherein the deposition steps are performed by molecular beam epitaxy.

6. The method of claim 5 wherein the step of providing the partial antireflective coating is performed by chemical vapor deposition.

7. The method of claim 5 wherein the step of providing the partial antireflective coating comprises the step of depositing the coating from a source positioned closer to the substrate than a source employed to deposit the multi-layer region.

\* \* \* \* \*